United States Patent
Zhang et al.

(10) Patent No.: US 11,114,439 B2
(45) Date of Patent: Sep. 7, 2021

(54) MULTI-DIVISION 3D NAND MEMORY DEVICE

(71) Applicant: Yangtze Memory Technologies Co., Ltd., Hubei (CN)

(72) Inventors: Zhong Zhang, Hubei (CN); Yan Ni Li, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 0 days.

(21) Appl. No.: 17/004,871

(22) Filed: Aug. 27, 2020

(65) Prior Publication Data

US 2020/0395361 A1 Dec. 17, 2020

Related U.S. Application Data

(63) Continuation of application No. 16/166,813, filed on Oct. 22, 2018, now Pat. No. 10,790,285, which is a
(Continued)

(51) Int. Cl.
*H01L 27/10* (2006.01)
*G11C 7/18* (2006.01)
(Continued)

(52) U.S. Cl.
CPC ...... *H01L 27/1052* (2013.01); *G06F 12/0238* (2013.01); *G11C 7/18* (2013.01); *G11C 16/04* (2013.01); *H01L 27/11573* (2013.01); *H01L 27/11578* (2013.01); *H01L 27/249* (2013.01); *H01L 27/2454* (2013.01)

(58) Field of Classification Search
CPC ........... H01L 27/1052; H01L 27/11578; H01L 27/249; H01L 27/2454; H01L 27/11573; G06F 12/0238; G11C 7/18
See application file for complete search history.

(56) References Cited

U.S. PATENT DOCUMENTS

| 10,840,183 B2 * | 11/2020 | Yun .................. H01L 27/11575 |
| 2010/0052042 A1 * | 3/2010 | Tanaka .............. H01L 27/11556 257/324 |

(Continued)

FOREIGN PATENT DOCUMENTS

| CN | 105074923 A | 11/2015 |
| CN | 106098693 A | 11/2016 |

(Continued)

OTHER PUBLICATIONS

International Search Report and Written Opinion of the International Search Authority directed to related PCT Application No. PCT/CN2018/099792, dated May 13, 2019; 9 pages.

*Primary Examiner* — Ajay Ojha
(74) *Attorney, Agent, or Firm* — Sterne, Kessler, Goldstein & Fox P.L.L.C.

(57) ABSTRACT

Disclosed is a method for forming a staircase structure of 3D memory. The method includes providing a substrate, forming an alternating layer stack over the substrate, forming a plurality of block regions over a surface of the alternating layer stack, forming a first plurality of staircase structures to expose a portion of a first number of top-most layer stacks at each of the block regions and removing the first number of the layer stacks at a second plurality of staircase structures at each of the block regions.

20 Claims, 8 Drawing Sheets

Related U.S. Application Data continuation of application No. PCT/CN2018/099792, filed on Aug. 10, 2018.

(51) Int. Cl.
| | | |
|---|---|---|
| *H01L 27/105* | (2006.01) | |
| *G06F 12/02* | (2006.01) | |
| *H01L 27/11573* | (2017.01) | |
| *H01L 27/11578* | (2017.01) | |
| *H01L 27/24* | (2006.01) | |
| *G11C 16/04* | (2006.01) | |

(56) References Cited

U.S. PATENT DOCUMENTS

| | | |
|---|---|---|
| 2011/0121403 A1 | 5/2011 | Lee et al. |
| 2013/0009274 A1* | 1/2013 | Lee .................. H01L 29/02 |
| | | 257/499 |
| 2015/0137205 A1 | 5/2015 | Kim et al. |
| 2015/0287913 A1 | 10/2015 | Sakuma et al. |
| 2015/0340095 A1 | 11/2015 | Tanzawa |
| 2016/0322376 A1 | 11/2016 | Lee et al. |
| 2016/0365354 A1 | 12/2016 | Lee et al. |
| 2018/0336950 A1 | 11/2018 | Jeong et al. |
| 2019/0319042 A1* | 10/2019 | Baek ................ H01L 27/11573 |
| 2020/0051983 A1 | 2/2020 | Zhang et al. |

FOREIGN PATENT DOCUMENTS

| | | |
|---|---|---|
| CN | 106252355 A | 12/2016 |
| CN | 107039457 A | 8/2017 |
| CN | 106920794 A | 7/2018 |
| TW | I 630709 B | 7/2018 |

\* cited by examiner

MULTI-DIVISION 3D NAND MEMORY DEVICE

CROSS-REFERENCES TO RELATED APPLICATIONS

This application is a continuation of U.S. Non-provisional patent application Ser. No. 16/166,813, titled "Multi-Division 3D NAND Memory Device," filed on Oct. 22, 2018, which claims the priority to PCT Application No. PCT/CN2018/099792 filed on Aug. 10, 2018, the entire contents of which are incorporated herein by reference.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. 3D memory architecture includes a memory array and peripheral devices for controlling signals to and from the memory array. A 3D memory architecture can include a stack of word lines arranged over a substrate, with a plurality of semiconductor channels through and intersecting word lines into the substrate. The intersection of a word line and a semiconductor channel forms a memory cell.

BRIEF SUMMARY

Embodiments of a method for forming a staircase structure of 3D memory devices are described in the present disclosure. The disclosed structures and methods provide numerous benefits including, but not limiting to, reduce fabrication complexity and manufacturing cost of 3D memory devices.

Disclosed is a method for forming a staircase structure in a three-dimensional (3D) memory device. The method can include forming an alternating layer stack over a substrate and using a first repetitive etch-trim process to form a first plurality of first staircase structures in a portion of block regions of the alternating layer stack. The method can also include using a second repetitive etch-trim process to form the first plurality of second staircase structures in the portion of block regions by superimposing a third staircase structure on each of the first staircase structures. Additionally, the method can include removing a plurality of steps at a second plurality of second staircase structures.

In some embodiments, a semiconductor structure includes a substrate and a first plurality of layer stacks disposed over the substrate, wherein the first plurality of layer stacks has a first number of layer stacks. The semiconductor structure further includes a second plurality of layer stack disposed over the first plurality of layer stack, wherein the second plurality of layer stacks has the first number of layer stacks. The semiconductor structure further includes a first staircase structure disposed over the substrate and a second staircase structure horizontally abutting the first staircase structure. A step of the first staircase structure exposes a portion of a layer stack of the first plurality of layer stacks. A step of the second staircase structure exposes a portion of a layer stack of the second plurality of layer stacks. The first staircase structure includes a second number of steps in a first horizontal direction and a third number of steps in a second horizontal direction.

In some embodiments of the semiconductor structure, the second staircase structure further includes the second number of steps in the first horizontal direction and the third number of steps in the second horizontal direction.

In some embodiments of the semiconductor structure, a top step of the first staircase structure is at least the first number of levels lower than that of the second staircase structure.

In some embodiments of the semiconductor structure, the first number is equal to the product of the second and the third number of steps.

In some embodiments of the semiconductor structure, each step of the first and the second staircase structure in the first horizontal direction is the third number of levels.

In some embodiments of the semiconductor structure, each step of the first and the second staircase structure in the second horizontal direction is one level.

In some embodiments of the semiconductor structure, each layer stack of the first or the second plurality of layer stacks includes an insulating material layer and a conductive material layer.

In some embodiments of the semiconductor structure, the conductive material layer includes one or more of tungsten, poly-crystalline silicon, silicide, nickel, titanium, platinum, aluminum, titanium nitride, tantalum nitride, or tungsten nitride.

In some embodiments, a method for forming a semiconductor structure includes forming a plurality of layer stacks over a substrate and forming a first plurality of staircase structures, wherein a step of each staircase structure exposes a portion of a layer stack of the plurality of layer stacks. The formation of the first plurality of staircase structures includes removing a portion of one or more top layer stacks in the plurality of layer stacks using a first mask stack, trimming the first mask stack, and repeating the removing and trimming operations to form a first number of steps in a first horizontal direction for each staircase structure. The method further includes forming a second mask stack to cover a second plurality and expose a third plurality of staircase structures from the first plurality of staircase structures, wherein each of the second plurality of staircase structures is adjacent to a respective staircase structure from the third plurality of staircase structures. The method also includes removing a second number of layer stacks of the plurality of layer stacks using the second mask stack.

In some embodiments of the method, the formation of the first plurality of staircase structures further includes forming a third mask stack to cover the first plurality of staircase structures in the first horizontal direction; removing a portion of one or more top layer stacks in the plurality of layer stacks using the third mask stack, trimming the third mask stack; and repeating, sequentially, the removing and trimming operations to form a third number of steps in a second horizontal direction for each staircase structure.

In some embodiments of the method, a top step of a staircase structure from the third plurality of staircase structure is at least the second number of levels lower than that from the second plurality of staircase structures.

In some embodiments of the method, the second number used in the method is equal to or larger than the product of the first and the third number used in the method.

In some embodiments of the method, the forming of the first, the second, and the third mask stack includes using a lithography process.

In some embodiments of the method, the removal of the second number of layer stacks of the plurality of layer stacks includes dry etching, wet etching or a combination thereof.

In some embodiments of the method, the trimming the first mask stack includes etching the first mask stack incrementally and inwardly from a boundary of the first mask stack.

In some embodiments of the method, the forming the plurality of layer stacks includes depositing each layer stack using chemical vapor deposition (CVD), physical vapor deposition (PVD), plasma-enhanced CVD (PECVD), sputtering, metal-organic chemical vapor deposition (MOCVD), atomic layer deposition (ALD), or a combination thereof.

In some embodiments, a memory device includes a substrate, a first plurality of layer stacks disposed over the substrate and a second plurality of layer stacks disposed over the first plurality of the layer stacks. Additionally, a vertical memory string can extend through the first and the second plurality of layer stacks and a first and a second staircase structure can be disposed adjacent to the vertical memory string, wherein the first staircase structure exposes a portion of each layer stack of the first plurality of layer stack, and the second staircase structure exposes a portion of each stack of the second plurality of layer stacks, where the first staircase structure horizontally abuts the second staircase structure. Each of the first and the second staircase structure can include a first number of steps in a first horizontal direction and a second number of steps in a second horizontal direction.

In some embodiments of the memory device, each layer stack of the first and the second plurality of layer stacks includes a conductive layer in contact with a portion of the memory string.

In some embodiments of the memory device, each of the first number of steps in the first horizontal direction is the second number of levels and each of the second number of steps in the second horizontal direction is one level.

In some embodiments of the memory device, a top step of the first staircase structure is at least a third number of levels lower than that of the second staircase structure, where the third number is equal to larger than the product of the first and the second number.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

DETAILED DESCRIPTION

Figure 1:
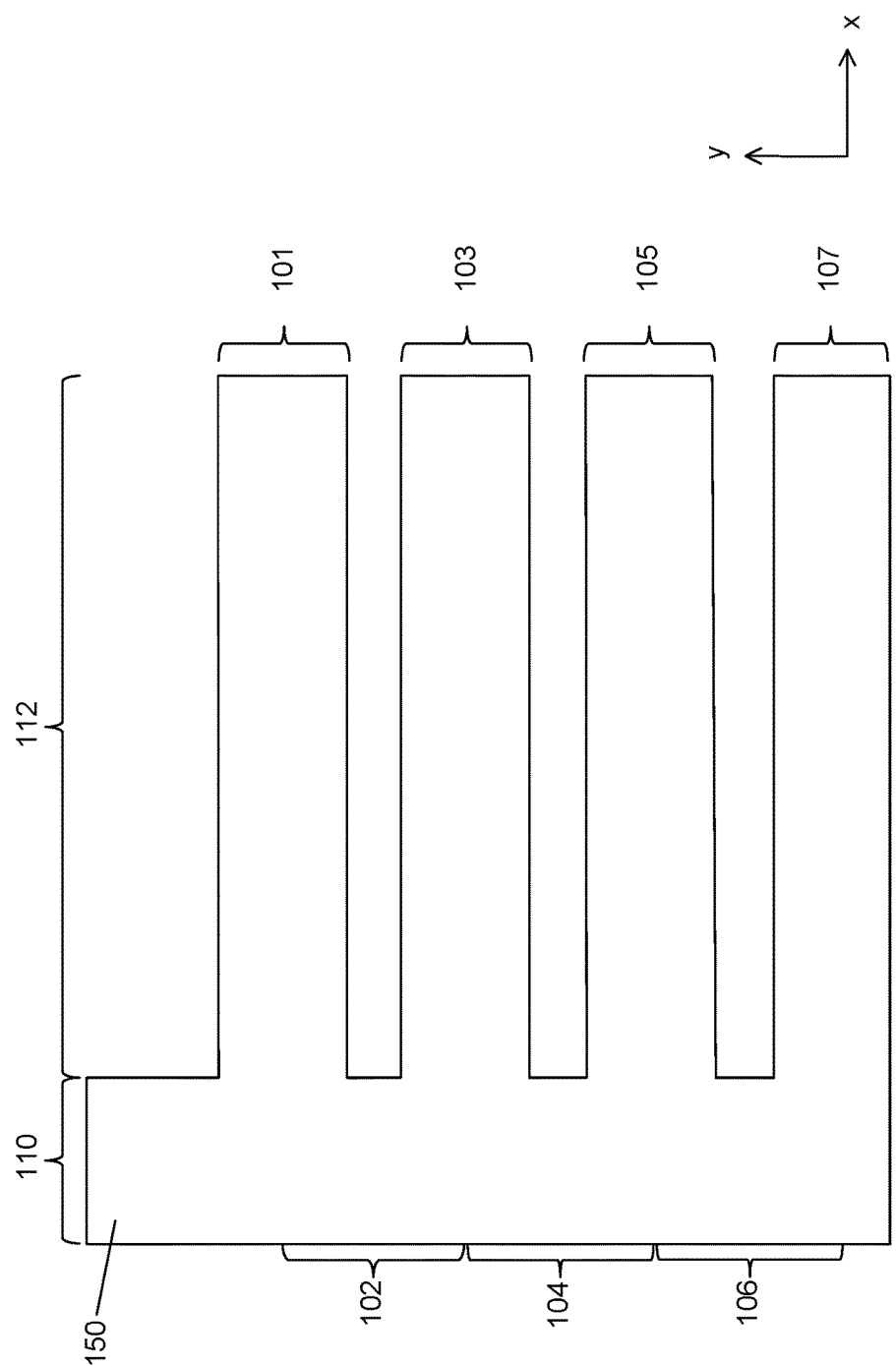
FIG. 1 illustrates a top view of an exemplary 3D memory structure, according to some embodiments.

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer therebetween. Moreover, "above" or "over" not only means "above" or "over" something, but can also include the meaning it is "above" or "over" something with no intermediate feature or layer therebetween (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a top surface and a bottom surface. The top surface of the substrate is where a semiconductor device is formed, and therefore the semiconductor device is formed at a top side of the substrate. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

In the present disclosure, the term "horizontal/horizontally/lateral/laterally" means nominally parallel to a lateral surface of a substrate.

As used herein, the term "3D memory device" refers to a semiconductor device with vertically oriented strings of memory cell transistors (referred to herein as "memory strings," such as NAND strings) on a laterally-oriented substrate so that the memory strings extend in the vertical direction with respect to the substrate. As used herein, the term "vertical/vertically" means nominally perpendicular to the lateral surface of a substrate.

In some embodiments, a NAND string or a 3D memory device includes a semiconductor channel (e.g., a silicon channel) that extends vertically through a plurality conductor/dielectric layer pairs, where the semiconductor channel is surrounded by a dielectric stack. The plurality of conductor/dielectric layer pairs are also referred to herein as an "alternating conductor/dielectric stack." The conductor layer of the alternating conductor/dielectric stack can be used as a word line (electrically connecting one or more control gates). An intersection of a word line and the semiconductor channel forms a memory cell. Vertically-oriented memory strings require an electrical connection between a word line and an access line (e.g., back end of line (BEOL) interconnection) so that each of the memory cells along the memory strings or in the 3D memory device can be selected for writing or reading functions, where the electrical connection is provided by forming a staircase structure at the plurality of conductor/dielectric pairs.

An exemplary method for forming the staircase structure includes repetitively applying an etch-trim process on an alternative conductor/dielectric layer stack. Each iteration of the etch-trim process includes etching a portion of a dielectric layer, etching a portion of a conductor layer, and trimming a mask layer. The staircase structure with a number of steps is formed by repeating these acts as many times as the number of conductor layers in the stack. The height of each step is one level which is equal to a total thickness of a conductor/dielectric layer.

The staircase structure can provide an electrical connection between a word line and an access line to control a memory string (semiconductor channels) after an interconnect formation process. Each of the conductor/dielectric layer stack in the staircase structure intersects a portion of a memory string. An example of an interconnect formation process includes disposing or otherwise depositing, a second insulating material, such as silicon oxide, spin-on-dielectric, or borophosphosilicate glass (BPSG), over the staircase structure and planarizing the second insulating material. Each of the conductor layers in the staircase structure is exposed to open a plurality of contact holes in the planarized second insulating material and the contact holes are filled with one or more conductive materials, such as titanium nitride and tungsten, to form a plurality of Vertical Interconnect Access (VIA) structures.

In a 3D memory device, memory cells for storing data are vertically stacked along memory strings in a stack storage region of the 3D memory device. The stack storage region includes the memory strings. The 3D memory device can include a plurality of staircase structures disposed adjacent to the stack storage region for purposes such as word line fan-out. As the demand for higher storage capacity continues to increase, the number of vertical levels of the staircase structures also increases. Accordingly, it is challenging to balance the manufacturing throughput and the process complexity/cost.

In the present disclosure, a staircase structure refers to a set of surfaces that include at least two horizontal surfaces (e.g., along x-y plane) and at least two (e.g., first and second) vertical surfaces (e.g., along z-axis) such that each horizontal surface is adjoined to a first vertical surface that extends upward from a first edge of the horizontal surface, and is adjoined to a second vertical surface that extends downward from a second edge of the horizontal surface. Each of the horizontal surfaces is referred as a "step" or "stair" of the staircase structure. In the present disclosure, a horizontal direction can refer to a direction (e.g., the x-axis or the y-axis) parallel with a top surface of the substrate (e.g., the substrate that provides the fabrication platform for formation of structures over it), and a vertical direction can refer to a direction (e.g., the z-axis) perpendicular to the top surface of the structure.

A staircase structure can be formed from a plurality of layer stacks by repetitively etching each layer stack using a mask layer formed over the dielectric stack layer, where each layer stack is also referred to as a "staircase layer" (or "SC layer") of the staircase structure in the present disclosure. A step of the staircase structure exposes a portion of a top surface of a layer stack (e.g. a SC layer) of the plurality of layer stacks. In the present disclosure, a layer stack (e.g. a SC layer) of the plurality of layer stacks is one level. In other words, each layer stack is one level high vertically.

FIG. 1 illustrates a top view of a 3D memory device 100. 3D memory device 100 includes a plurality of SC layers formed over a substrate. A top surface of the plurality of SC layers includes a stack storage region 110 and a staircase region 112 adjacent to stack storage region 110. In some embodiments, more than one staircase regions are adjacent to stack storage region 110. A mask stack 150, formed over a portion of a surface of the SC layers, covers stack storage region 110 and a portion of staircase region 112. In some embodiments, mask stack 150 covers staircase region 112 extensively in a first horizontal direction (e.g. x-direction). In some embodiments, mask stack 150 covers a portion of a plurality of staircase regions. The forming of mask stack 150 defines a plurality of finger regions (e.g. region 101, 103, 105, 107, . . . , etc.) at staircase region 112. 3D memory device 100 can then be divided into a plurality of block regions (e.g. region 102, 104, 106, . . . , etc.) where each block region includes a portion of stack storage region 110, a portion of a first finger region, a portion of a second finger region, and an area within staircase region 112, exposed by mask stack 150, between the first and the second finger regions.

In some embodiments, the substrate can include any suitable material for supporting the 3D memory device. For example, the substrate can include silicon, silicon germanium, silicon carbide, silicon on insulator (SOI), germanium on insulator (GOI), glass, gallium nitride, gallium arsenide, any suitable III-V compounds, any other suitable material, and/or combinations thereof.

In some embodiments, each of the SC layers can include a dielectric layer pair with a first material layer and a second material layer. In some embodiments, the first material layer and the second material layer can have nominally the same height over the substrate so that one set can form one step. In some embodiments, a thickness of each SC layer can be the same or different from each other. The first material layer can be an insulating layer including silicon oxide and the second material layer can be a sacrificial layer including silicon nitride. In some embodiments, the sacrificial layer is replaced with a conductive material layer (e.g., a gate metal material) to form word lines of a 3D memory device. In some embodiments, the second material layer can be a conductive material layer. In some embodiments, the sacrificial layer can include any suitable material different from the insulating material layers. For example, the sacrificial layer can include one or more of poly-crystalline silicon, silicon nitride, poly-crystalline germanium, poly-crystalline germanium-silicon, any other suitable material, and/or combinations thereof. In some embodiments, the sacrificial layer can include silicon nitride. The insulating layer can include any suitable insulating materials, e.g., silicon oxide or aluminum oxide. The conductive material layer can include any suitable conductive material. In some embodiments, the conductive material layer can include one or more of tungsten, poly-crystalline silicon, silicide, nickel, titanium, platinum, aluminum, titanium nitride, tantalum nitride, tungsten nitride, any other suitable material, and/or combinations thereof. The forming of the insulating material layer, the sacrificial material layer and the conductive material layer can include any suitable deposition methods such as, for example, chemical vapor deposition (CVD), physical vapor deposition (PVD), plasma-enhanced CVD (PECVD), sputtering, metal-organic chemical vapor deposition (MOCVD), atomic layer deposition (ALD), any other suitable deposition method, and/or combinations thereof.

In some embodiments, mask stack 150 can include a photoresist (PR) or carbon-based polymer material. In some embodiments, a coverage of mask stack 150 on stack storage region 110 and a portion of staircase region 112 is formed using one or more patterning processes including lithography or etching process.

Figure 2A:
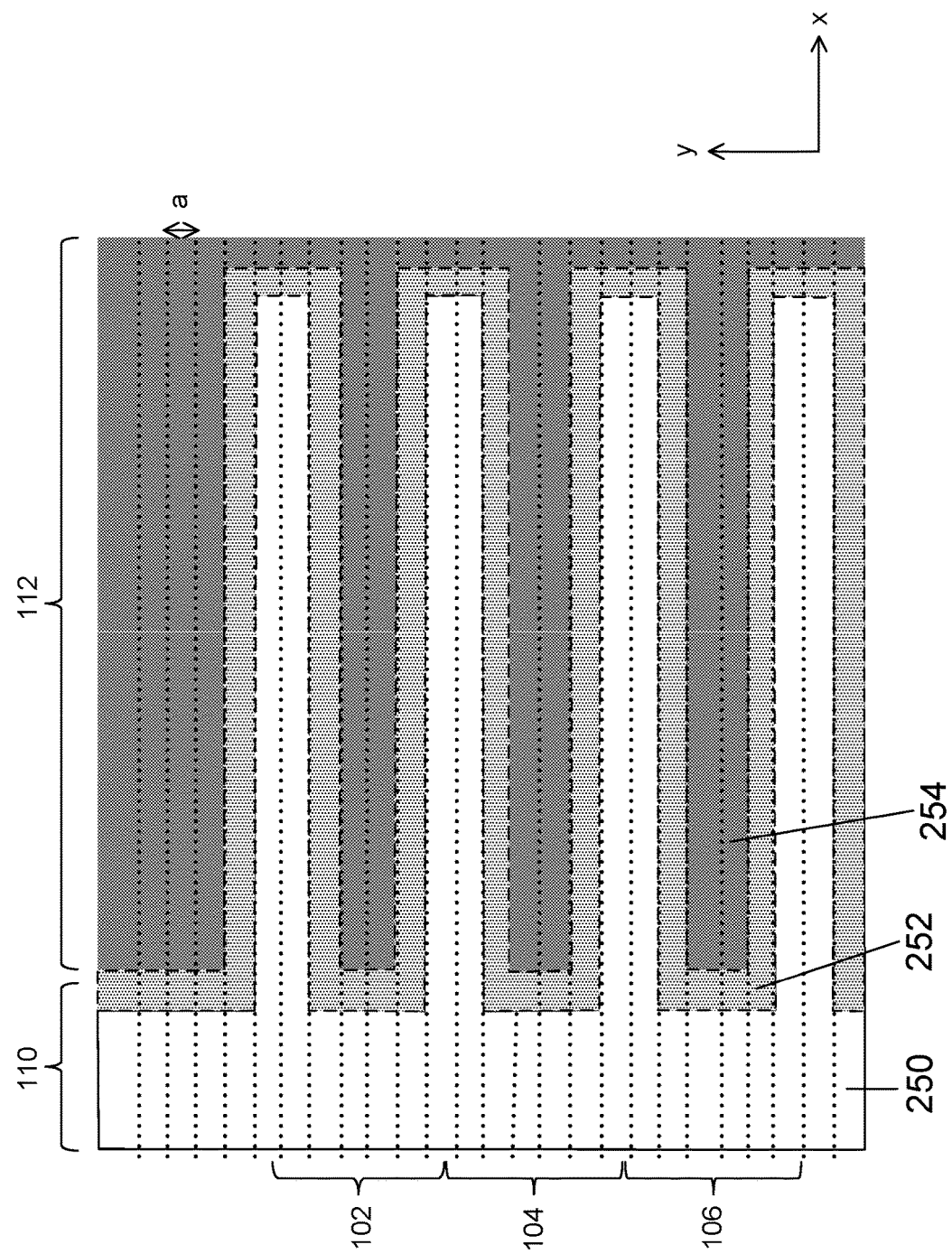
FIG. 2A illustrates a top view of an exemplary 3D memory structure after forming a first staircase structure at a portion of each of the block regions, according to some embodiments.
Figure 2B:
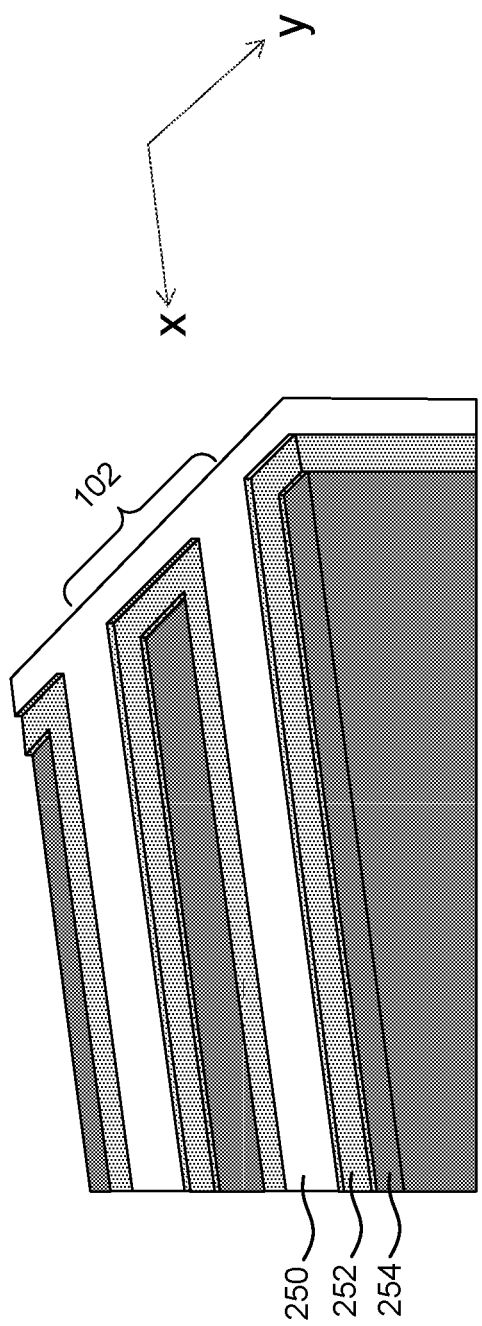
FIG. 2B illustrates a 3D-view of block regions, according to some embodiments.

FIG. 2A-2B are respective top and 3D views of 3D memory device 200 with a plurality of first staircase structures disposed at a portion of each of the block regions (e.g. region 102, 104, 106, . . . , etc.) within staircase region 112. The first staircase structures are disposed at each side of each of the block regions at staircase region 112 at least in a second horizontal direction (e.g. y-direction), where the second horizontal direction is perpendicular to the first horizontal direction (e.g. x-direction). The first staircase structures are formed by applying a repetitive etch-trim process on the 3D memory device 100 using mask stack 150, where the etch-trim process can include an etching process and a trimming process. In some embodiments, the etch-trim process can include more than one etching or trimming processes. As shown in FIG. 2A, a first staircase structure includes three steps formed at sides of each block regions, where each step of the three steps is one level. The first staircase structure exposes a portion of a surface of three top-most SC layers 250, 252 and 254 of 3D memory device 200. The corresponding 3D view of the first staircase structure further illustrating block region 102 is shown in FIG. 2B. In some embodiments, the first staircase structure includes a first number (N) of steps on sides of each block regions (e.g. region 102), where the first number is larger than one (N≥2) and each of the N steps has one level. In some embodiments, the first staircase structure exposes a portion of a surface of N of top-most SC layers. In some embodiments, each of the block regions has more than two steps (N≥2) formed at a side in the first horizontal direction (e.g. x-direction side) and sides in the second horizontal direction (e.g. y-direction sides). In some embodiments, sides of each of the block regions includes more than two steps (N≥2) formed at the second horizontal direction (e.g. y-direction). In some embodiments, 3D memory device 200 can include more than one staircase regions adjacent to stack storage region 110, where a plurality of the first staircase structures are disposed at each of the staircase regions.

The etching process can include using any suitable etchants (e.g., wet etch and/or dry etch) to sequentially remove the first material layer and the second material layer of each SC layers. In some embodiments, two different etchants are used to respectively remove the first material layer and the second material layer. The etchant for the first material layer has higher etching selectivity over the second layer material layer, and/or vice versa. Accordingly, the underlying SC layer can function as an etch-stop layer so that only the single SC layer is patterned/etched. In some embodiments, the first and the second material layers are etched using anisotropic etching such as reactive ion etch (RIE) or other dry etch. In some embodiments, the etchant includes carbon tetrafluoride (CF$_4$) based gases or hexafluoroethane (C$_2$F$_6$) based gases. In some embodiments, one etchant can be used in a timed wet etch process to remove both the first material layer and the second material layer, and the etchant includes phosphoric acid. The methods and etchants to remove the layer stack described herein are exemplary. Other methods and etchants are within the spirit and scope of the present disclosure.

The trimming process includes a suitable etch (e.g., an isotropic dry etch or a wet etch) performed on mask stack 150 in directions parallel to a surface of the substrate. Mask stack 150 is etched incrementally and inwardly from the boundary of mask stack 150 by the trimming process. The amount of trimming mask stack 150 can be directly relevant to a first lateral dimension of each steps of the first staircase structure, where the first lateral dimension is represented by a separation, "a", between dash lines in FIG. 2A. In some embodiments, the first lateral dimension, "a", of each steps in the first staircase structure is between 10 nm and 100 nm in the second horizontal direction. In some embodiments, the first lateral dimension, "a", of each steps in the first staircase structure is between 10 nm and 100 nm in both the first and the second horizontal direction. In some embodiments, a first lateral dimension of a first step in the first staircase structure can be different from another first lateral dimension of another step in the first staircase structure.

Figure 3A:
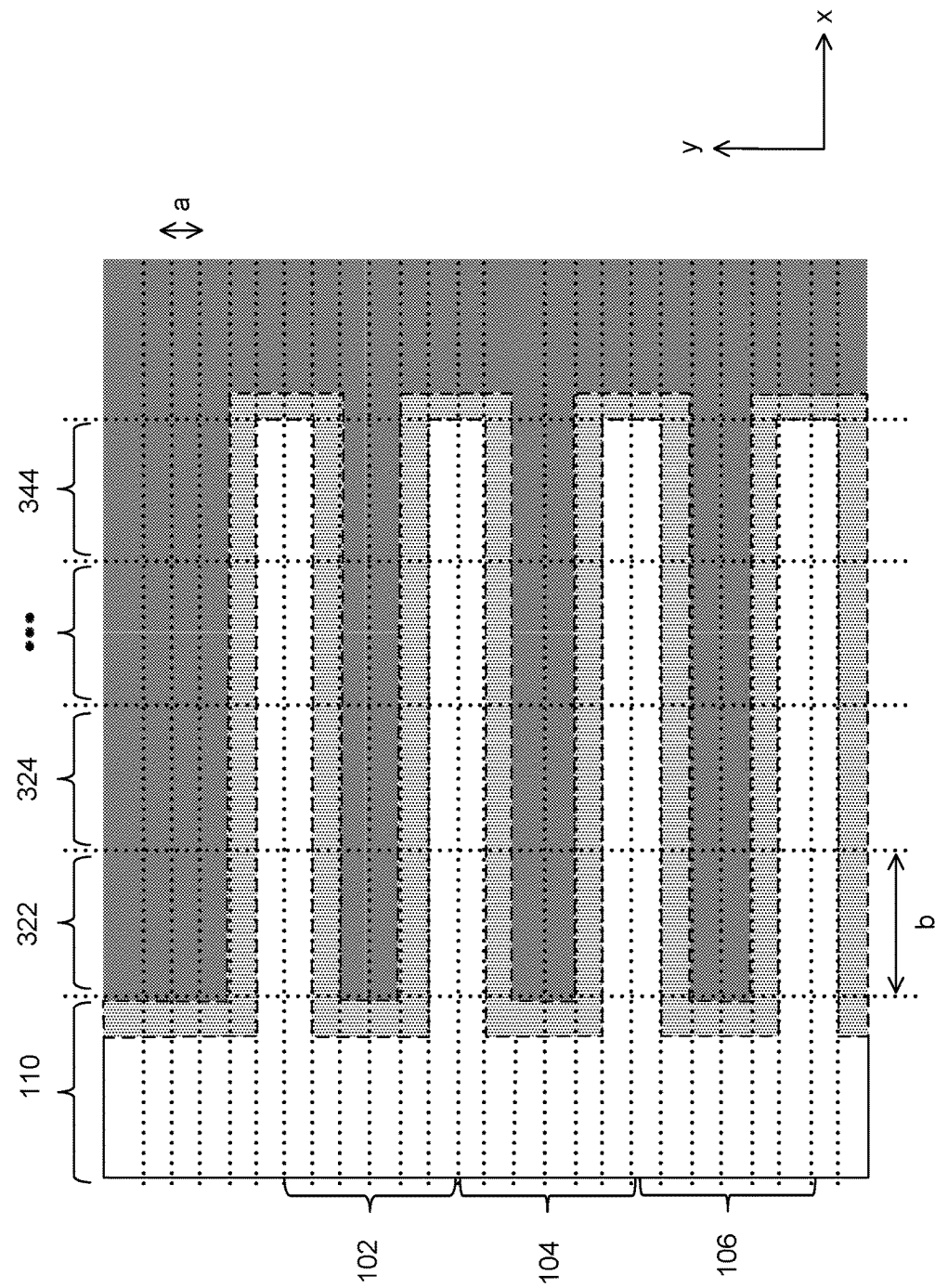
FIG. 3A illustrates a top view of an exemplary 3D memory structure after forming a second staircase structure at each of the block regions, according to some embodiments.
Figure 3B:
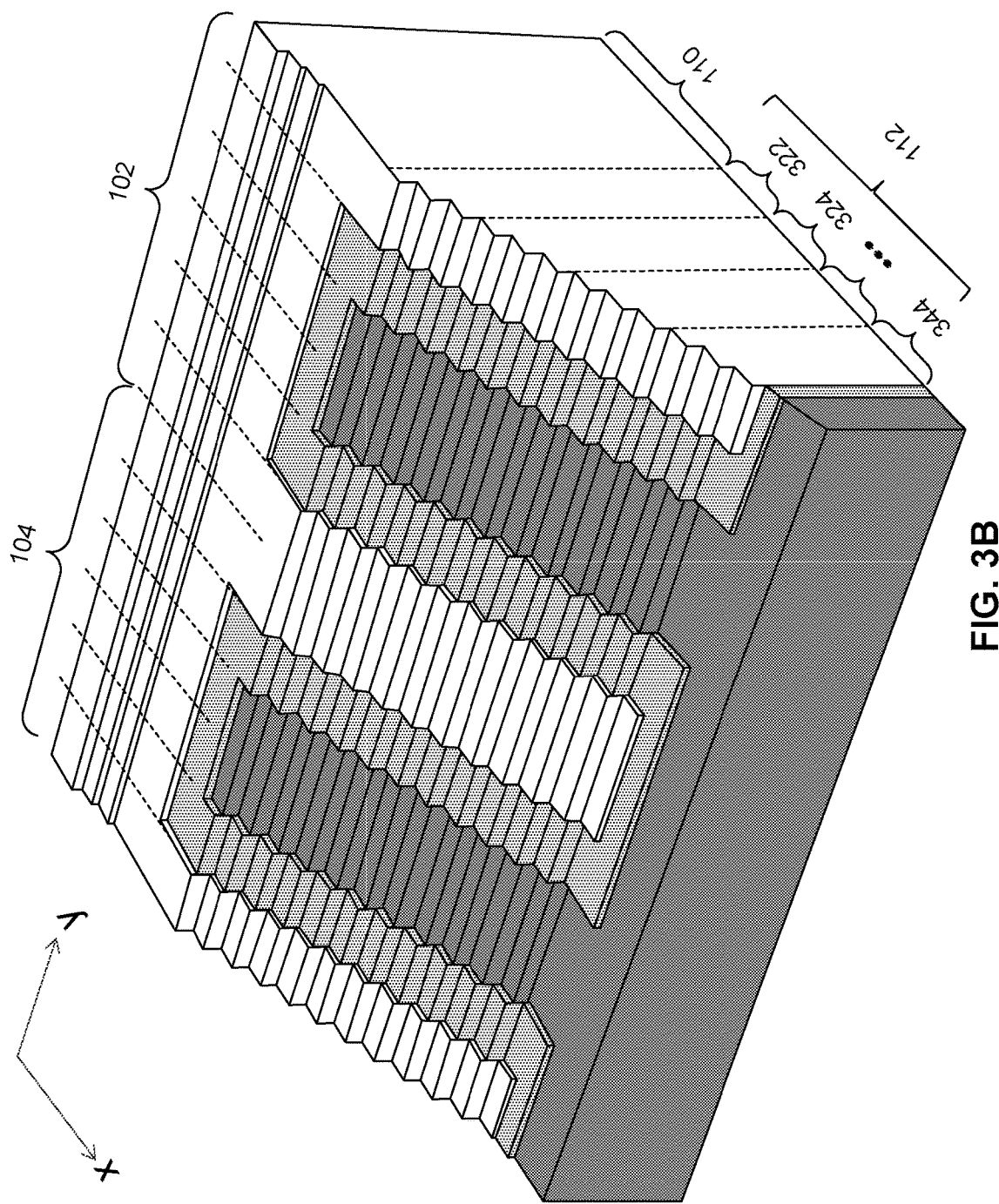
FIG. 3B illustrates a 3D-view of the block regions, according to some embodiments.

FIG. 3A illustrates a top view of 3D memory device 300 with a plurality of second staircase structures disposed at sides of each of the block regions. In some embodiments, two second staircase structures are disposed in each block region, where a second staircase structure is adjacent to another second staircase structure. In some embodiments, two second staircase structures are disposed in each block region, where both of the second staircase structures are mirror-symmetric to each other with respect to a horizontal axis (e.g. x-axis) parallel to the first horizontal direction. Forming the second staircase structure can include applying a repetitive etch-trim process on 3D memory device 200 using a mask stack (not shown), where the mask stack exposes an edge of each block region in the first horizontal direction (e.g., x-direction) and covers the 3D memory device 200 extensively in the second horizontal direction (e.g., y-direction). One or more etching processes, included in the etch-trim process, are used to remove the first number (N) of the consecutive SC layers, where the one or more etching process include any other wet/dry etching processes. A trimming process, included in the etch-trim process, determines a second lateral dimension along the first horizontal direction of each steps of the second staircase structure, where the second lateral dimension is represented by a separation "b" between dash lines in FIG. 3A. In some embodiments, each second staircase structure includes a second number (P) of steps in the first horizontal direction (e.g., x-direction) and the first number (N) steps in the second horizontal direction (e.g., y-direction). Each of the P steps in the first horizontal direction has N levels and each of the N steps in the second horizontal direction has one level. In some embodiments, a step in the first horizontal direction has the second lateral dimension "b" along the first horizontal direction, and other steps in the second horizontal direction has the first lateral dimension "a". In some embodiments, the second lateral dimension, "b", of each steps in the second staircase structure can be between 10 nm and 100 nm in the first horizontal direction. The mask stack is then removed to expose a top surface of 3D memory device 300. As shown at FIG. 3B, two second staircase structures, are disposed at each block region (e.g. region 102 or 104), where each second staircase structure has twelve steps (P=12; staircase 322, 324, . . . , and 344) along the first horizontal direction (e.g., x-direction) and three steps (N=3) in along second horizontal direction (e.g., y-direction), where each of the twelve steps (P=12) has three (N=3) levels and each of the three (N=3) steps has one level. A plurality of unexposed SC layers are under each second staircase structure. In some embodiments, a second staircase structure, disposed over a plurality of unexposed SC layers, includes P steps in the first horizontal direction (e.g., x-direction) and N steps in the second horizontal direction (e.g., y-direction), where the number of P or N can be any positive number larger than one (N≥2, P≥2). Each of the P steps in the first horizontal direction (e.g. x-direction) has N levels, where each of the N steps in the second horizontal direction (e.g., y-direction) has one level. In some embodiments, each of the P steps in the first horizontal direction has the second lateral dimension. In some embodiments, each of the N steps in the second horizontal direction has the first lateral dimension. In some embodiments, the 3D memory device 300 can include more than one staircase regions adjacent to stack storage region 110, where a plurality of the second staircase structures are disposed at each of the staircase regions.

Figure 4:
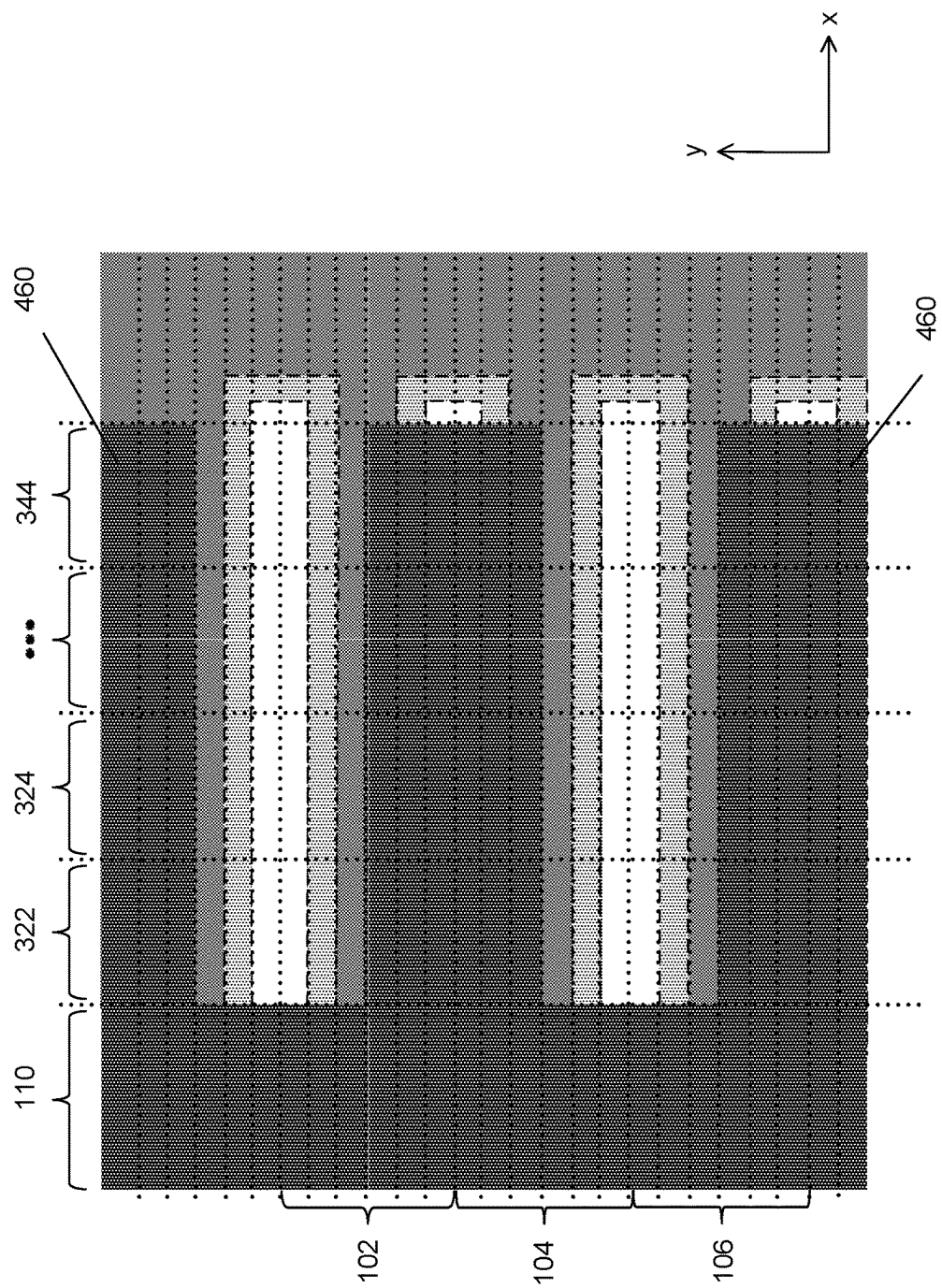
FIG. 4 illustrates a top view of an exemplary 3D memory structure, according to some embodiments.

FIG. 4 illustrates a top view of 3D memory device 400 after forming mask stack 460 over a portion of 3D memory device 300. As shown in FIG. 4, mask stack 460 covers a second staircase structure and exposes another second staircase structure of each block region, where the both second staircase structures are adjacent to each other. In some embodiments, mask stack 460 covers half of each block region in the second horizontal direction (e.g. y-direction). In some embodiments, mask stack 460 covers a portion of each block region extensively in the first horizontal direction (e.g. x-direction) and exposes a portion of the each block region in the second horizontal direction (e.g. y-direction). In some embodiments, mask stack 460 covers a first plurality and exposes a second plurality of the second staircase structures in 3D memory device 400, where each of the first plurality of the second staircase structures is adjacent to a respective staircase structure from the second plurality of the second staircase structures. In some embodiments, mask stack 460 covers stack storage region 110. In some embodiments, the material and the formation of mask stack 460 is similar to those of mask stack 150.

Figure 5:
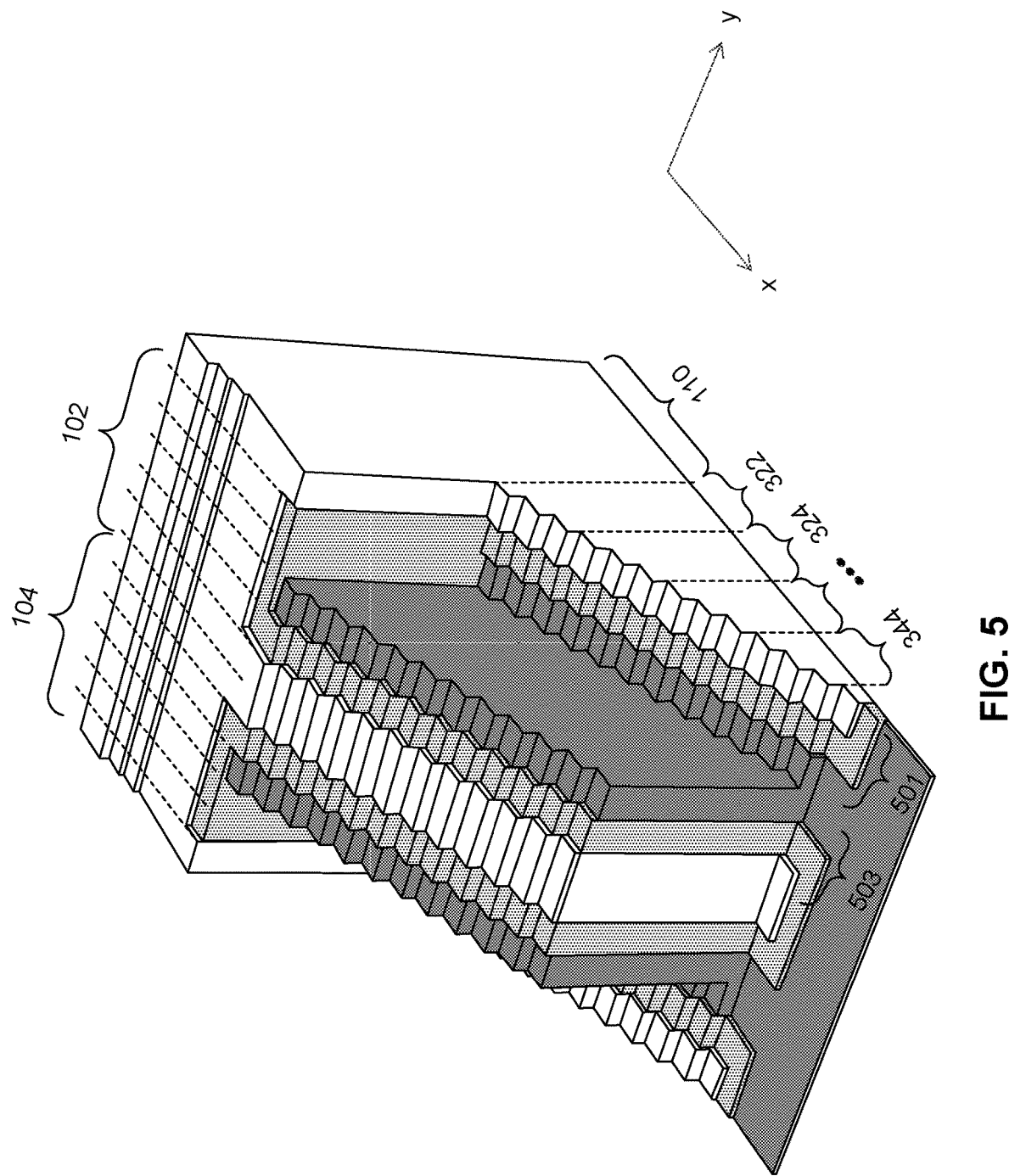
FIG. 5 illustrates a 3D-view of the block regions, according to some embodiments.

FIG. 5 illustrates an exemplary 3D view of 3D memory device 500 after applying an etching process to remove 36 (N×P=3×12=36) of consecutive SC layers at the exposed portions of each blocking regions of 3D memory device 400, followed by removing mask stack 460. In some embodiments, the etching process removes N times P (NP) of consecutive SC layers from the exposed portions of 3D memory device 400, where the number of P and N represent the number of steps in the second staircase structure in the first and the second horizontal direction, respectively. The etching process can include any dry/wet etching process. As shown at FIG. 5, two staircase structures (e.g. staircase structure 501 and 503) are disposed at each block region of 3D memory device 500, where one of the two staircase structures (e.g. staircase structure 503) has the same number of steps in both the first and the second horizontal directions as the other disposed staircase structure (e.g. staircase structure 501). In some embodiments, two staircase structures are disposed at each block region of 3D memory device 500, where one of the two staircase structures (e.g. staircase structure 501) abuts another staircase structure (e.g. staircase structure 503) of the two staircase structures in a horizontal direction (e.g. in y-direction). In some embodiments, two staircase structures are disposed at each block region, where one structure of the second staircase structures is mirror-symmetric to another structure of the second staircase structure with respect to a horizontal axis (e.g. x-axis) parallel to a horizontal direction (x-direction). In some embodiments, two staircase structures are disposed at each block region of 3D memory device 500, where a top-most SC layer (corresponds to a top step) of a staircase structure of the two staircase structures (staircase structure 501) is at least thirty-six (N×P=3×12=36) levels lower than that of another staircase structure of the two staircase structures (staircase structure 503). In some embodiments, each block region of the 3D memory device 500 contains two staircase structures, where a top-most SC layer (corresponding to a top step) of a staircase structure of the two staircase structures is at least N times P (NP) levels lower than that of another staircase structure of the two staircase structures. In some embodiments, each block region of 3D memory device 500 at least exposes a portion of 72 (2×N×P=2×3×12=72) of SC layers. In some embodiments, all staircase structures in each block region of 3D memory device 500 at least expose a portion of twice of N times P (2×N×P) of SC layers. After the formation of 3D device 500, a sacrificial layer of each SC layer can be replaced with a conductive layer. The each conductive layer in the staircase structures is in contact with a portion of a memory string to control an operation of the portion of the memory string (corresponds to a memory cell).

Figure 6:
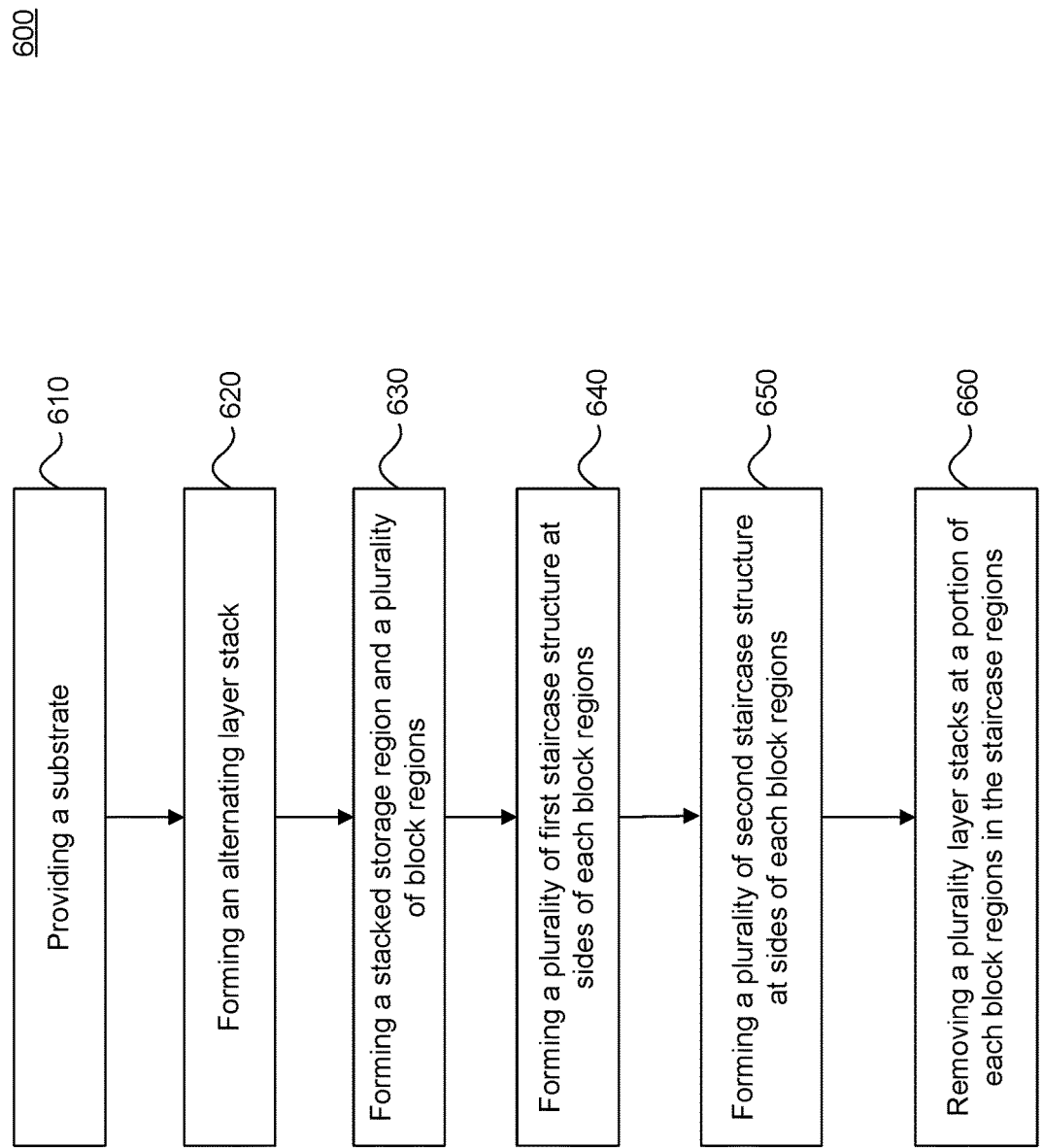
FIG. 6 is a flowchart of an exemplary method for forming a 3D memory device, according to some embodiments.

Embodiments of the present disclosure further provide a method for forming a staircase structure in a 3D memory device. FIG. 6 illustrates an exemplary method 600 for forming a 3D memory device, according to some embodiments. The operations of method 600 can be used to form memory device structures illustrated in FIGS. 1-5. It should be understood that the operations shown in method 600 are not exhaustive and that other operations can be performed as well before, after, or between any of the illustrated operations. In some embodiments, some operations of exemplary method 600 can be omitted or include other operations that are not described here for simplicity. In some embodiments, operations of method 600 can be performed in a different order and/or vary.

In operation 610, a substrate is provided to from the 3D memory device. The substrate can include any suitable material for forming the three-dimensional memory structure. For example, the substrate can include silicon, silicon germanium, silicon carbide, SOI, GOI, glass, gallium nitride, gallium arsenide, plastic sheet and/or other suitable III-V compound.

In operation 620, an alternating layer stack are deposited over the substrate. Each layer stack of the alternating layer stack represents a SC layer. A SC layer can include a dielectric layer pair with a first material layer and a second material layer In some embodiments, the first material layer can be an insulating layer and the second material layer can be an sacrificial layer, and vice versa. In some embodiments, the first material layer can be the insulating layer and the second material layer can be a conductive material layer. The sacrificial layer can include materials such as silicon nitride, poly-crystalline silicon, poly-crystalline germanium, poly-crystalline germanium-silicon, any other suitable material, and/or combinations thereof. The insulating layer can include materials such as silicon oxide, aluminum oxide or other suitable materials. The conductive material layer can include materials such as tungsten, titanium nitride, tantalum nitride, tungsten nitride, any other suitable material, and/or combinations thereof. Each of the insulating, sacrificial, and conductive material layers can include materials deposited by one or more thin film deposition processes including, but not limiting to, CVD, PVD, ALD, or any combinations thereof.

At operation 630, a mask stack is used to pattern a stack storage region and one or more block regions on a top surface of the SC layers. Each block region is adjacent to the stack storage region. In some embodiments, the stack storage region and the plurality of block regions are formed by the mask stack using a plurality of processes including lithography. In some embodiments, the mask stack can include photoresist or carbon-based polymer material. An example of the stack storage region and the plurality of block regions can be regions 110 and 102, 104 and 106 as described above in FIG. 1.

At operation 640, a plurality of first staircase structures are formed at sides of each block region. The first staircase structures can be formed by repetitively performing an etch-trim process using the mask stack. The etch-trim process includes an etching process and a trimming process. In some embodiments, the etching process etches a portion of a SC layer. In some embodiments, the etching process etches a portion of a plurality of SC layers. In some embodiments, one or more etchants are used in the etching process, and each of the etchants etches the first material layer at higher etch rate than the second material layer, or vice versa (e.g. high etching selectivity between the first material layer and the second material layer). In some embodiments, the etching process can precisely control the etching of SC layers because of high etching selectivity between the first and the second material layer. The trimming process includes a suitable etch (e.g., an isotropic dry etch or a wet etch) of the mask stack and happens at directions parallel to a surface of the substrate. The amount of trimmed mask stack can be directly relevant to the lateral dimensions of the first staircase structure. After the repetitive etch-trim process, the resulting first staircase structure includes the first number (N) of steps, where each of the N steps is one level. The formation of the first staircase structures can be referred to the descriptions of FIG. 2A-2B.

At operation 650, a plurality of second staircase structures are formed at sides of each block region at the staircase regions. A mask stack is patterned to expose an edge of each block region in the first horizontal direction (e.g., x-direction). In some embodiments, the mask stack extensively covers the 3D memory device in a second horizontal direction (e.g., y-direction) perpendicular to the first horizontal direction. The second staircase structures can be formed at sides of each block region at the staircase regions by repeating the second number (P) times of a etch-trim process using the mask stack. The etch-trim process includes a trimming process and an etching process, which etches N of SC layers. Since the mask stack covers the 3D memory device extensively in the second horizontal direction, the entire repetitive etch-trim processes happen mostly at the first horizontal direction. The mask stack is then removed after finishing the repetitive etch-trim processes. The formation of the second staircase structures can be referred to the descriptions of FIGS. 3A-3B.

At operation 660, a mask stack is patterned to cover a portion of each block region in the staircase regions. In some embodiments, the mask stack covers the stack storage region. In some embodiments, the mask stack covers a portion of each block region in the second horizontal direction. In some embodiments, the mask stack is patterned by a lithography process. An etching process, similar to the etching process used in the etch-trim process, is applied to remove N times P (NP) of SC layers from the exposed portion of each of the block regions. The mask stack is removed after the etching process. As a result, a top-most SC layer at the exposed portion of each of the block regions is at least N time P (NP) levels lower than that at the covered portion of the each of the block regions. An example of operation 660 can be referred to the description of FIGS. 4-5.

The present disclosure describes various embodiments of 3D memory device and methods of forming the same. In some embodiments, the 3D memory device includes a substrate, a plurality semiconductor channel in a storage structure and a plurality of staircase structures adjacent to the storage structure. Each of the staircase structures includes a plurality of conductor material layers and a plurality of insulating layers arranged alternatingly. In some embodiments, a conductor material layer and an insulating material layer vertically adjacent to the conductor material layer form a staircase.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A semiconductor structure, comprising:
a substrate; and
a plurality of layer stacks disposed over the substrate, wherein the plurality of layer stacks comprises first and second staircase structures abutting each other, wherein:
a bottommost step of the second staircase structure is separated from and higher than a topmost step of the first staircase structure;
each of the first and the second staircase structures comprises P steps in a first direction;
each of the P steps comprises N steps, wherein P and N are natural numbers greater than or equal to 1; and
each of the N steps of the first staircase structure extends towards a second direction, wherein each of the N steps of the second staircase structure extends towards another direction opposite to the second direction.

2. The semiconductor structure of claim 1, wherein the plurality of layer stacks comprises Q layer stacks, and wherein Q is natural number greater than or equal to 2NP.

3. The semiconductor structure of claim 1, wherein another topmost step of the second staircase structure is Q levels higher than another bottommost step of the first staircase structure, and wherein Q is natural number greater than or equal to 2NP.

4. The semiconductor structure of claim 1, wherein a direction between a topmost step of the P steps of the first staircase structure and another topmost step of the P steps of the second staircase structure is substantially parallel to the second direction.

5. The semiconductor structure of claim 1, wherein the second staircase structure abuts the first staircase structure in the second direction, and wherein P is greater than N.

6. The semiconductor structure of claim 1, wherein a separation between another bottommost step of the first staircase structure and the topmost step of the first staircase structure is substantially equal to another separation between the bottommost step of the second staircase structure and another topmost step of the second staircase structure.

7. A semiconductor structure, comprising:
a stack storage region disposed over a substrate; and
a plurality of layer stacks surrounding the stack storage region, comprising:
a first staircase structure abutting the stack storage region in a first direction;
a second staircase structure abutting the first staircase structure in a second direction, wherein:
each of the first and the second staircase structures comprises P steps in the first direction;
each of the P steps of the first and the second staircase structures comprises N steps in the second direction, wherein P and N are natural numbers greater than or equal to 1; and
a topmost step of the second staircase structure is higher than another topmost step of the first staircase structure; and
a third staircase structure abutting the first staircase structure in a third direction, wherein the third staircase structure comprises P steps in the first direction, and wherein each of the P steps of the third staircase structure comprises N steps in the third direction.

8. The semiconductor structure of claim 7, wherein each of the P steps of the first and the second staircase structure is N levels.

9. The semiconductor structure of claim 7, wherein each of the N steps of the first and the second staircase structure is 1 level.

10. The semiconductor structure of claim 7, wherein the topmost step of the second staircase structure is Q levels higher than the other topmost step of the first staircase structure, and wherein Q is a natural number greater than or equal to NP.

11. The semiconductor structure of claim 7, wherein bottommost steps of the N steps of each of the P steps of the first staircase structure are aligned with one another in the second direction.

12. The semiconductor structure of claim 7, wherein bottommost steps of the N steps of each of the P steps of the second staircase structure are aligned with one another in the second direction.

13. A semiconductor structure, comprising:
a stack storage region disposed over a substrate;
a first plurality of layer stacks surrounding the stack storage region;
a second plurality of layer stack disposed over the first plurality of layer stack;
a first staircase structure abutting the stack storage region in a first direction and comprising P steps in the first direction, wherein:
   the first staircase structure exposes each layer stack of the first plurality of layer stacks; and
   each of the P steps of the first staircase structure comprises N steps extending in a second direction; and
a second staircase structure abutting the first staircase structure in the second direction, wherein:
   the second staircase structure exposes each layer stack of the second plurality of layer stacks;
   the second staircase structure comprises P steps in the first direction, wherein each of the P steps of the second staircase structure comprises N steps extending in another direction opposite to the second direction;
   a bottommost step of the second staircase structure is higher than a topmost step of the first staircase structure; and
   a separation between the bottommost step of the second staircase structure and the stack storage region is substantially equal to another separation between another bottommost step of the first staircase structure and the stack storage region.

14. The semiconductor structure of claim 13, wherein P and N are natural numbers greater than or equal to 1.

15. The semiconductor structure of claim 13, wherein the first plurality of layer stacks has Q layer stacks, wherein the bottommost step of the second staircase structure is Q levels higher than the other topmost step of the first staircase structure, wherein Q is a natural number greater than or equal to 2.

16. The semiconductor structure of claim 13, wherein a direction between the stack storage region and the bottommost step of the second staircase region is substantially parallel to the first direction.

17. The semiconductor structure of claim 13, wherein each layer stack of the first and the second plurality of layer stacks comprises a conductive layer, and wherein the stack storage region comprises a memory string extending through each of the conductive layers.

18. The semiconductor structure of claim 1, further comprising a third staircase abutting the first staircase structure in a third direction, wherein the third staircase structure comprises P steps extending in the first direction, and wherein each of the P steps of the third staircase structure comprises N steps extending in the third direction.

19. The semiconductor structure of claim 13, further comprising a third staircase abutting the first staircase structure in a third direction, wherein the third staircase structure comprises P steps extending in the first direction, and wherein each of the P steps of the third staircase structure comprises N steps extending in the third direction.

20. The semiconductor structure of claim 13, wherein the first and second directions are perpendicular to each other.

* * * * *